ELECTRICAL INTERCONNECTION DEVICE

Filed March 6, 1957 2 Sheets-Sheet 1

INVENTOR.
LAWRENCE J. KAMM

BY [signature]
ATTORNEY

ELECTRICAL INTERCONNECTION DEVICE

Filed March 6, 1957 2 Sheets-Sheet 2

INVENTOR.
LAWRENCE J. KAMM
BY
ATTORNEY

United States Patent Office 3,002,169

Patented Sept. 26, 1961

3,002,169
ELECTRICAL INTERCONNECTION DEVICE

Lawrence J. Kamm, San Diego, Calif., assignor to General Dynamics Corporation, San Diego, Calif., a corporation of Delaware Filed Mar. 6, 1957, Ser. No. 644,405
6 Claims. (Cl. 339—18)

This invention relates to devices for interconnecting electrical circuits, and more particularly to an electrical interconnection device for selectively interconnecting a plurality of electrical circuits.

The interconnection device of this invention serves to selectively interconnect any one circuit of a plurality of electrical circuits to any other circuit. Circuit interconnecting devices of various types are known to the art. Manual devices such as patchboards and plugboards require skilled personnel to complete the desired interconnections by selecting and operating the proper switches or insert the plugs of jumper wires into the proper jacks. When a complex interconnection of a plurality of circuits is required, a considerable amount of time is required, even by a skilled operator, to set up the required interconnections. Such devices are satisfactory for temporary circuit interconnections where it is not likely to be necessary to provide the same interconnecting circuit in the future, or semipermanent interconnections wherein the circuit is to be used for a considerable length of time. However patchboards and plugboards are large and bulky in order to accommodate interconnecting wires for complex circuits and crosstalk between wires and leakage between jacks are frequent sources of trouble in complex interconnections. In addition, plugs may be accidentally disconnected due to vibration or carelessness, and are difficult to locate.

Further, in many cases it is desirable to preserve an interconnection arrangement for future use. The wiring of a patchboard normally cannot be preserved, thereby requiring preservation of a wiring diagram and completely rewiring the patchboard when the wiring arrangement is again required. While wired plugboards may be preserved for future use, they are so heavy, space-consuming, fragile and expensive that preservation of only a few of the most frequently employed arrangements is economically feasible.

The circuit interconnection device of this invention employs a thin, light, easily prepared, stored and used circuit interconnection defining panel. Conductor panels bearing a plurality of conductive elements applied by "printed" or etched circuit techniques cooperate with the circuit interconnection defining panel. Each of the conductive elements borne by the conductor panels may be permanently connected to a single circuit. The conductor panels and the circuit interconnection defining elements cooperate when placed in juxtaposition to interconnect a plurality of circuits, one to another.

It is, therefore, an object of this invention to provide a device capable of selectively interconnecting a plurality of circuits simultaneously.

Another object of this invention is to provide a selective circuit interconnecting device having interchangeable circuit defining means.

Another object of this invention is to provide a circuit interconnecting device having a conductor panel connected to a plurality of circuits cooperating with interchangeable circuit interconnection defining means.

Another object of this invention is to provide a circuit interconnecting device having a conductor panel connected to a plurality of circuits cooperating with a circuit interconnection defining panel which is readily replaceable and storable.

Another object of this invention is to provide a circuit interconnecting device having an etched circuit conductor panel connected to a plurality of circuits cooperating with a circuit interconnection defining panel.

Another object of this invention is to provide a circuit interconnecting device which is compact, light, inexpensive to manufacture, secure in use, enables rapid and easy change of circuit interconnections and enables compact storage and reuse of circuit interconnection defining devices.

Other objects and advantages of this invention will be apparent in the following description and claims considered together with the accompanying drawings, wherein:

Figure 1:
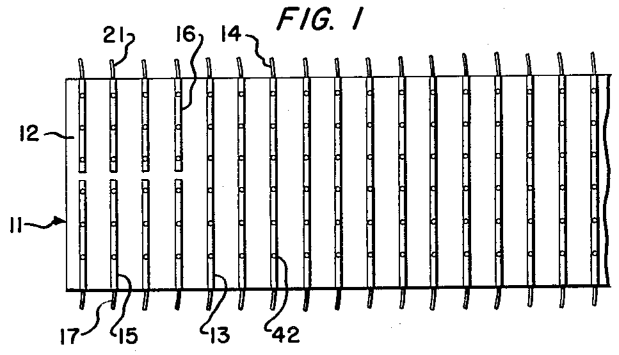
FIGURES 1 and 1A illustrate a first conductor panel.
Figure 1A:
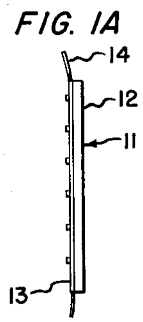
Figure 2:
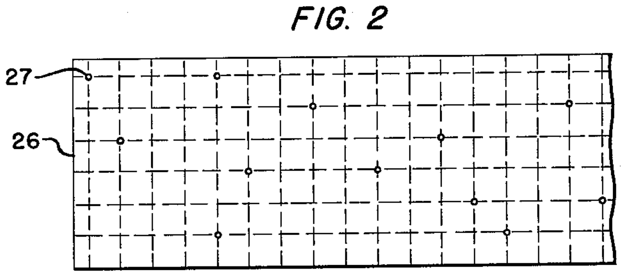
FIGURES 2 and 2A illustrate a circuit interconnection defining panel.
Figure 2A:
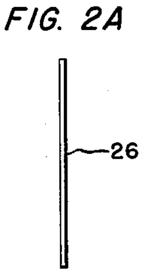
Figure 3:
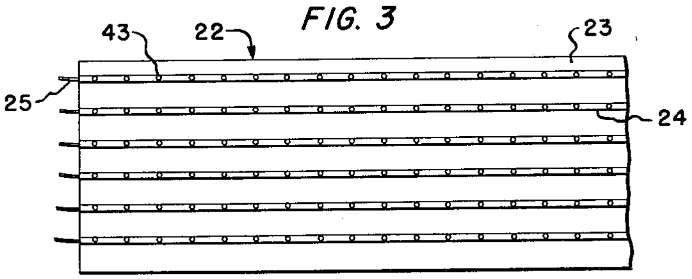
Figure 3A:
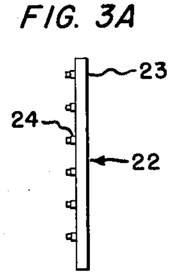
Figure 4:
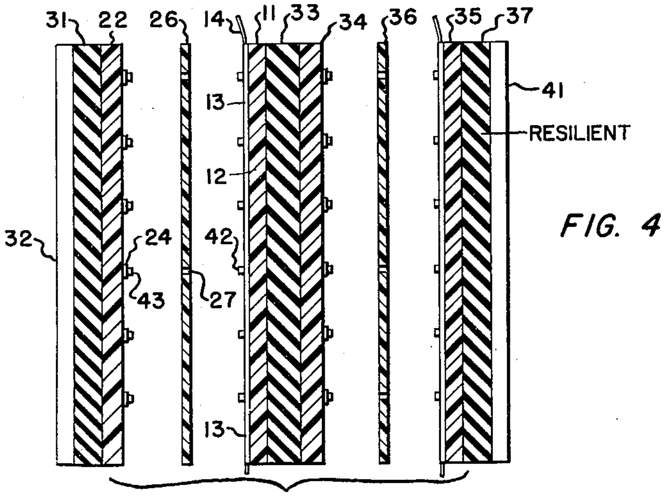
Figure 5:
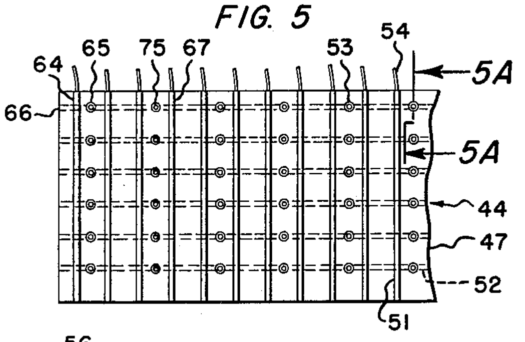
Figure 5A:
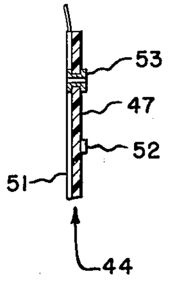
Figure 6:
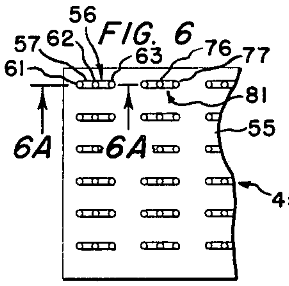
Figure 6A:
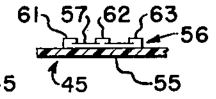
Figure 7:
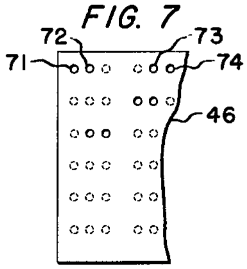
Figure 8:
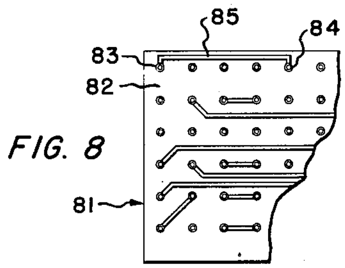
Figure 8A:
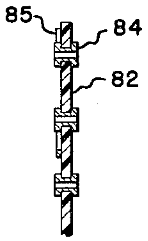
Figure 9:
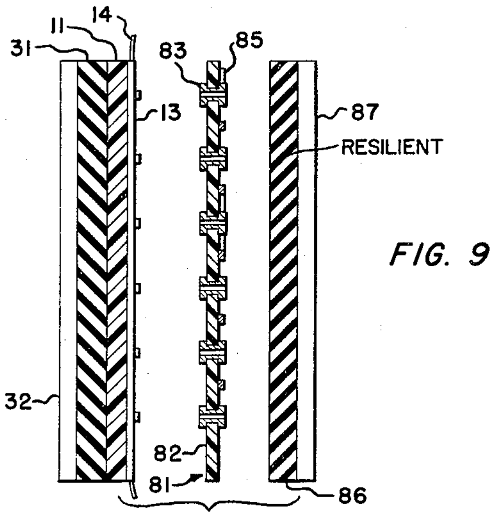

FIGURES 3 and 3A illustrate a second conductor panel cooperating with the conductor panel of FIGURES 1 and 1A and the circuit interconnection defining panel of FIGURES 2 and 2A, FIGURE 4 illustrates the interrelationship between the conductor panels and the circuit interconnection defining panel, FIGURES 5 and 5A illustrate a modified conductor panel, FIGURES 6 and 6A illustrate a conductor panel adapted to cooperate with the conductor panel of FIGURES 5 and 5A, FIGURE 7 illustrates a circuit interconnection defining panel adapted to cooperate with the conductor panels of FIGURES 5, 5A, 6 and 6A, FIGURES 8 and 8A illustrate a modified circuit interconnection defining panel adapted to cooperate with the conductor panel of FIGURES 1 and 1A, and FIGURE 9 illustrates the interrelationship between the circuit interconnection defining panel of FIGURES 8 and 8A and the conductor panel of FIGURES 1 and 1A.

Referring now to FIGURES 1 and 1A, a first conductor panel 11 includes a thin, flexible rectangular supporting surface 12, fabricated of a suitable insulating material. Bonded to supporting surface 12 are a plurality of linear conductive elements such as conductive element 13, parallel to the short edge of the rectangle. Each conductive element is connected to an electrical circuit by means of a conductor, exemplarily conductor 14, connected to conductive element 13. Each conductive element may extend from one edge of supporting surface 12 to the other, in a manner similar to conductive element 13. Other conductive elements, exemplarily elements 15 and 16, may extend across only a portion of the width of the supporting surface 12. Each of the short elements 15 and 16 are connected to an individual electrical circuit by means of conductors 17 and 21, respectively.

A second conductor panel 22, adapted to cooperate with conductor panel 11, is illustrated in FIGURES 3 and 3A. A thin, flexible, rectangular supporting surface 23, similar to supporting surface 12 has bonded thereto a plurality of conductive elements such as conductive element 24. Each conductive element is connected to an electrical circuit by means of a conductor, exemplarily conductor 25 connected to conductive element 24. The conductive elements bonded to rectangular supporting surface 23 are substantially parallel to the long side of the rectangle and perpendicular to the conductive elements, such as 16, bonded to supporting surface 12. The conductive elements associated with conductor panel 22 may extend entirely across the longer dimension of the rectangular supporting surface 23, or individual conductive elements extending partially across conductor panels 22 in a manner similar to conductive elements 15 and 16 associated with conductor panel 11.

A circuit interconnection defining panel 26, illustrated in FIGURES 2 and 2A, is provided to cooperate with conductor panels 11 and 22. Circuit defining panel 26 comprises a thin sheet of insulating material of substantially the same size and shape as conductor panels 11 and 22. An aperture or hole may be punched or drilled through circuit defining panel 26 at the areas of intersection of the conductive elements associated with the circuits which it is desired to interconnect. Thus, if it is desired to interconnect the circuit connected to conductive element 13 by wire 14 to the circuit connected to conductive element 24 by wire 25, an aperture 27 is punched through circuit defining panel 26 at the point of intersection of conductive elements 13 and 24.

The manner in which conductor panels 11 and 22, and circuit interconnection defining panel 26 cooperate is illustrated by FIGURE 4. Conductor panel 22 is bonded to a layer 31 of compressible material such as rubber, which is in turn bonded to a stiff backing plate 32, preferably fabricated of metal. Conductor panel 11 is also bonded to a compressible layer 33, which may be bonded to a stiff backing plate similar to backing plate 32, as illustrated in FIGURE 4, which in addition may be bonded to another conductor panel 34 similar to conductor panel 22 in order to increase the number of circuits which may be interconnected simultaneously. Conductor panel 34 cooperates with conductor panel 35 and circuit interconnection defining panel 36. Conductor panel 35 is similar to conductor panel 11, and is similarly bonded to a compressible layer 37 of rubber or similar material, which may in turn be bonded to another conductor panel, or, as illustrated, to a stiff backing plate 41 similar to backing plate 32.

Suitable mechanical, hydraulic or electrical compressing means, well known in the art, such as the clamping mechanism disclosed on page 116 of Ingenious Mechanisms for Designers and Inventors," volume III, published in 1951 by The Industrial Press, New York, may be employed to compress the assembly of conductor panels and circuit defining panels by applying the necessary force to backing plates 32 and 41. Application of pressure to backing plates 32 and 41 forces the conductor panels 22, 11, 34 and 35 into intimate contact with circuit interconnection defining panels 26 and 36. At those points where apertures are present in circuit interconnection defining panels 26 and 36, the conductor panels deform inwardly slightly, forcing the conductors bonded thereto into conductive contact through the aperture. Slightly raised projections such as projections 42 and 43 may be furnished on the conductive strips at the points of intersection to more easily enable contact to be established through the apertures in the circuit interconnection defining panel, thereby requiring less force to be exerted on backing plates 32 and 41. Conductor panels 11, 22, 34 and 35 may be permanently mounted in a suitable manner enabling application of pressure to backing plates 32 and 41 by suitable compressing means. Release of pressure enables circuit defining panels 26 and 36 to be removed and replaced by circuit interconnection defining panels defining and enabling other circuit interconnections. The circuit defining panels removed may be readily stored for future use.

A second embodiment of this invention includes a first conductor panel 44, illustrated in FIGURES 5 and 5A, a second conductor panel 45, illustrated in FIGURES 6 and 6A, and a circuit interconnection defining panel 46, illustrated in FIGURE 7. Conductor panel 44 comprises a rectangular supporting surface 47 fabricated of a suitable insulating material, a first plurality of spaced conductive elements, such as conductive element 51 substantially parallel to the shorter dimension of the rectangle, are bonded to one face of supporting surface 47, and a second plurality of spaced conductive elements, such as conductive element 52, substantially perpendicular to said first plurality of conductive elements are bonded to the reverse face of supporting surface 47. A plurality of conductive paths, such as 53, are provided in apertures through supporting surface 47 from each of the conductive elements, such as 52, on the reverse side of the supporting surface to the obverse face of the supporting surface midway between each pair of conductive elements on the obverse side. The conductive paths are connected to the conductive elements on the reverse face of the supporting surface, but are not normally connected to the conductive elements on the obverse face of the supporting surface. The conductive elements such as conductive element 51, on the obverse face of supporting surface 47 are each connected to an electrical circuit by means of a conductor, such as conductor 54, suitably fastened to said conductive elements such as conductive element 51.

Second conductor panel 45, illustrated in FIGURES 6 and 6A, comprises a supporting surface 55 fabricated of a suitable insulating material, and a plurality of conductive bridging elements such as element 56 bonded to supporting surface 55 in a plurality of vertical and horizontal rows. Conductive bridging elements such as 56 each comprise a thin, narrow conductive strip 57 having a length equal to the distance between the conductive elements, such as 51, on the obverse face of conductor panel 44. Bridging element 56, exemplary of the plurality of bridging elements on conductor panel 15, is furnished with three unitary projections 61, 62 and 63. Projections 61 and 63 are positioned at either end of a conductive strip 57 and are adapted to conductively contact the conductive elements such as 51 on the obverse face of conductor panel 44 in the manner to be disclosed hereinbelow. Projection 62 is positioned substantially in the center of conductive strip 57 and is adapted to contact the conductive paths, such as 53, running from the reverse face to the obverse face of conductor panel 44 in the same manner as projections 61 and 63. Circuit interconnection defining panel 46 is fabricated of a suitable insulating material wherein apertures may be drilled, punched or otherwise formed to enable circuit interconnection. As illustrated by FIGURE 7, a plurality of dashed circles placed in the same relative positions as projections 61, 62 and 63 on conductive elements such as 56, may be imprinted on circuit interconnection defining panel 46 to facilitate positioning of the apertures to enable the desired interconnections.

As disclosed hereinabove, the conductive elements, such as 51, on the obverse face of conductor panel 44 are each connected to an individual electrical device. Interconnection between such devices is obtained by positioning conductor panels 44 and 45 on either side of circuit interconnection defining panel 46 in a manner similar to that disclosed hereinabove in connection with conductor panels 11 and 22 and circuit interconnection defining panel 26, illustrated by FIGURE 4. Thus, conductor panel 44 replaces conductor panel 22, conductor panel 45 replaces conductor panel 11, and circuit interconnection defining panel 46 replaces circuit interconnection defining panel 26 in FIGURE 4. As pressure is applied to the assembly, projection 61 connects conductive element 64 to conductor strip 57 through aperture 71, and conductive path 65 connected to conductive element 66 on the reverse face of conductor panel 44 is connected to projection 62 through aperture 72 in circuit defining panel 46. Thus, conductive element 64, connected to an electrical device, is connected to conductive element 66. Conductive element 66 may also be connected to an electrical device, thereby interconnecting the two electrical devices. However, in the arrangement of FIGURE 5, the electrical device connected to conductive element 64 is connected to the electrical device connected to conductive element 67 through aperture 71, projection 61, conductor strip 57, projection 62, aperture 72, conductive path 65, conductive element 66, a conductive path 75, aperture 73, projections 76 and 77 of bridging element 81, aperture 74, and conductor element 67.

A single conductor panel such as conductor panel 11, illustrated in FIGURES 1 and 1A, is required when the circuit interconnection defining panel 81, illustrated by FIGURES 8 and 8A, is employed in cooperation therewith. Circuit interconnection defining panel 81 comprises a supporting surface 82 fabricated of a suitable thin, flexible insulating material, a plurality of conducting paths such as 83 and 84 extending through supporting surface 82 from one face to the other, and conductive elements such as 85 interconnecting desired conducting paths.

Cooperation between conductor panel 11 and circuit defining panel 81 is illustrated by FIGURE 9. Conductor panel 11 is bonded to a compressible layer 31, which is in turn bonded to a stiff backing plate 32 in the manner disclosed hereinabove in connection with FIGURE 4. A second compressible layer 86 is bonded to a second backing plate 87. Circuit interconnection defining panel 81 is removably inserted between conductor panel 11 and compressible layer 86. Pressure applied to backing plates 31 and 87 enables contact to be established between conductive elements such as 13 on panel 11 and conducting paths such as 83 on circuit defining panel 81. Conductive elements such as 85 interconnect conductive paths such as 83 and 84 and thereby afford interconnection between electrical devices connected to conductive elements on conductor panel 11.

Conductive paths 53 and 83 may conveniently be eyelets, or, alternatively, may be electroplated, through apertures punched, drilled or otherwise formed through the supporting surface. Conductive elements such as 85 may be drawn using conductive inks or paints, or may be formed by "printed" or etched circuit techniques, well known to the art. In a similar manner, conductive elements on conductor panels 11, 22, 44 and 45 are preferably formed using "printed" or etched circuit techniques. However, other means known in the art of bonding thin conductive strips to insulating surfaces may be employed in connection with this invention. Wires connecting conductive elements such as 16, 25 and 54 to electrical circuits or devices may be soldered, brazed or welded directly to their respective conductive elements, or may be connected to soldering lugs or the like permanently attached to the conductive elements. Preferably, however, the conductors are soldered to removable connectors, thereby facilitating any changes in the permanent wiring. A suitable connector adapted for use with "printed" circuit panels is disclosed and claimed in Patent No. 2,748,364, issued to me May 29, 1956. It will be apparent, therefore, that the interconnecting device of the present invention greatly facilitates programming electronic analog computers, punched card business machines and other devices presently employing plugboards. When employed in place of plugboards, circuit interconnection defining panels of the type disclosed hereinabove may be readily prepared for each desired program, and compactly stored for future use.

While certain preferred embodiments of the invention have been specifically disclosed, it is understood that the invention is not limited thereto as many variations will be readily apparent to those skilled in the art and the invention is to be given its broadest possible interpretation within the terms of the following claims.

What I claim is:

1. An electrical interconnecting device including a first conductor panel comprising an insulating flexible supporting surface and a first plurality of conductive elements spaced from one another and fixed to said supporting surface, a second conductor panel comprising an insulating flexible supporting surface and a second plurality of conductive elements adapted to cooperate with said first plurality of conductive elements, each of said first plurality of conductive elements having a first plurality of conductive projections and each of said second plurality of conductive elements having a second plurality of conductive projections in cooperative relationship with said first plurality of conductive projections, means for establishing circuit paths between said first plurality of conductive elements and said second plurality of conductive elements, said means including a circuit interconnection defining panel disposed between said first plurality of conductive elements and said second plurality of conductive elements, said circuit interconnection defining panel including a plurality of predetermined electrical contact enabling means cooperating with said first and second pluralities of projections for selectively enabling interconnection between said first plurality of conductive elements and said second plurality of conductive elements, and compression means for applying a compressive force urging said first and second pluralities of conductive projections toward contact with one another to establish circuit paths selected by said circuit interconnection defining panel, said compression means comprising first and second resilient layers connected to said first and second conductor panels on the surfaces opposite said first and second pluralities of conductive elements, and first and second rigid backing plates fastened to said first and second resilient layers, whereby opposing forces applied to said backing plates enables a compressive force to be applied to said first and second conductor panels.

2. An electrical interconnecting device including a first conductor panel comprising a flexible supporting surface with a reverse side surface and a first plurality of conductive elements spaced from one another and fixed to said supporting surface, a second conductor panel comprising a flexible supporting surface with a reverse side surface and a second plurality of conductive elements spaced from one another and fixed to said supporting surface, rigid backing members positioned adjacent to said reverse side surfaces, resilient means positioned between said rigid members and respective ones of said reverse side surfaces, each of said plurality of conductive elements having a first plurality of conductive projections, and each of said second plurality of conductive elements having a second plurality of conductive projections, means for establishing selected circuit paths between said first plurality of conductive elements and said second plurality of conductive elements, said means including a circuit interconnection defining panel removably disposed between said first plurality of conductive elements and said second plurality of conductive elements, said circuit interconnection defining panel comprising an insulating surface having a plurality of predetermined contact enabling means cooperating with said first and second pluralities of conductive projections for selectively enabling interconnection between said first plurality of conductive elements and said second plurality of conductive elements, and means for connecting said conductive elements to electrical devices.

3. An electrical interconnecting device including a first conductor panel comprising a flexible supporting surface with a reverse side surface and a first plurality of conductive elements arranged in parallel rows, said first conductive elements being spaced from one another and fixed to said supporting surface, each of said first plurality of conductive elements having a first plurality of conductive projections, a second conductor panel comprising a flexible supporting surface with a reverse side surface and a second plurality of conductive elements arranged in parallel rows at an angle to said first plurality of conductive elements, said second conductive elements being spaced from one another and fixed to said supporting surface, each of said second plurality of conductive elements having a second plurality of conductive projections, means for establishing selected circuit paths between said first plurality of conductive elements and said second plurality of conductive elements, said means including a circuit interconnection defining panel removably disposed between said first plurality of conductive elements and said second plurality of conductive elements, said circuit interconnection defining panel comprising an insulated surface having apertures at selected intersections of said first and second conductive elements, compression means for applying a compressive force urging said first and second conductive panels toward one another for enabling interconnection between selected pairs of said first plurality of conductive projections on said first plurality of conductive elements and second plurality of conductive projections on said second plurality of conductive elements, said compression means including rigid backing members positioned adjacent to said reverse side surfaces and resilient means positioned between said rigid members and respective ones of said reverse side surfaces, and means for connecting said conductive elements to electrical devices.

4. An electrical interconnecting device including a first conductor panel comprising a rectangular flexible supporting surface with a reverse side surface and a first plurality of conductive elements arranged in rows parallel to one side of said rectangular supporting surface, said first conductive elements being spaced from one another and fixed to said supporting surface, each of said first plurality of conductive elements having a first plurality of conductive projections, a second conductor panel comprising a rectangular flexible supporting surface with a reverse side surface and a second plurality of conductive elements arranged in parallel rows perpendicular to the first plurality of conductive elements, said second conductive elements being spaced from one another and fixed to said supporting surface, each of said second plurality of conductive elements having a second plurality of conductive projections, means for establishing selected circuit paths between said first plurality of conductive elements and said second plurality of conductive elements, said means including a circuit interconnection defining panel removably disposed between said first plurality of conductive elements and said second plurality of conductive elements, said circuit interconnection panel comprising an insulating surface having apertures at selected intersections of said first and second conductive elements, compression means for applying a compressive force urging said first and second conductor panels toward one another for enabling interconnection between selected pairs of said first plurality of conductive projections on said first plurality of conductive elements and said second plurality of conductive projections on said second plurality of conductive elements, said compression means including rigid backing members positioned adjacent to said reverse side surfaces, resilient means positioned between said rigid backing members and said reverse side surfaces, and means for connecting said conductive elements to electrical devices.

5. An electrical interconnecting device including a conductor panel comprising a first insulating flexible supporting surface with a reverse side surface with a first plurality of conductive elements spaced from one another and fixed to said first supporting surface, a second insulating flexible supporting surface with a reverse side surface with a second plurality of conductive elements spaced from one another and fixed to said second supporting surface, said second plurality of conductive elements adapted to cooperate with said first plurality of conductive elements, each one of said first plurality of conductive elements having a first plurality of conductive projections and each one of said second plurality of conductive elements having a second plurality of conductive projections in cooperative relationship with said first plurality of conductive projections, means for establishing circuit paths between said projections, said means including a circuit interconnection defining panel disposed between said first plurality of conductive elements and said second plurality of conductive elements, said circuit interconnection defining panel including a plurality of apertures, each of said apertures receiving a pair of oppositely positioned ones of said projections permitting electrical contact therethrough, and compression means for applying a compressive force urging said first and second plurality of conductive projections toward contact with one another to establish circuit paths selected by the positioning of said apertures in said circuit interconnection defining panel, said compression means including first and second rigid backing members positioned adjacent said first and second reverse side surfaces, resilient means positioned between said rigid members and said reverse side surfaces, whereby opposing forces applied to said rigid backing members enables a compressive force to be applied to said first and second plurality of conductive elements, and connecting means for connecting said conductive elements to electrical devices.

6. In an electrical interconnection device, a first flexible panel member having first and second surfaces and a first plurality of electrically conductive elements on said second surface, each of said first plurality of conductive elements having a first plurality of conductive projections, a second flexible panel member having first and second surfaces and a second plurality of electrically conductive elements on said second surface, each conductive element of said second plurality of conductive elements having a second plurality of conductive projections arranged for interconnection with said first plurality of conductive projections, means for establishing selected circuit paths between said first plurality of conductive elements and said second plurality of conductive elements, said means including a circuit interconnection defining panel of insulating material disposed between said first plurality of conductive projections and said second plurality of conductive projections, said circuit interconnection defining panel having apertures disposed between selected adjacent pairs of said first and second conductive projections for receiving said adjacent projections therethrough enabling electrical connection therebetween, and compression means for applying a compressive force urging said first and second pluralities of conductive projections toward contact with one another, said compression means including a first rigid backing member positioned adjacent to said first surface of said first panel member and a second rigid backing member positioned adjacent to said first surface of said second panel member, resilient means positioned between said rigid backing members and said first surfaces of said first and second panel members, whereby opposing forces applied to said rigid members enables a compressive force to be applied to said first and second pluralities of conductive elements.

References Cited in the file of this patent

UNITED STATES PATENTS

| | | |
|---|---|---|
| 2,006,436 | Bowers | July 2, 1935 |
| 2,286,812 | Keefe | June 16, 1942 |
| 2,399,753 | McLarn | May 7, 1946 |
| 2,483,551 | Libman | Oct. 4, 1949 |
| 2,486,195 | Munsey | Oct. 25, 1949 |
| 2,613,287 | Geiger | Oct. 7, 1952 |
| 2,724,026 | Johnson | Nov. 15, 1955 |
| 2,744,172 | Porter et al. | May 1, 1956 |

OTHER REFERENCES

Martin, R.E.: Electronic Equipment, pages 12 and 13.